(12) United States Patent
Cieslinski

(10) Patent No.: US 9,972,656 B2
(45) Date of Patent: May 15, 2018

(54) IMAGE SENSOR AND METHOD OF READING OUT AN IMAGE SENSOR

(71) Applicant: Arnold & Richter Cine Technik GmbH & Co. Betriebs KG, Munich (DE)

(72) Inventor: Michael Cieslinski, Ottobrunn (DE)

(73) Assignee: Arnold & Richter Cine Technik GmbH & Co. Betriebs KG, Munich (DE)

( * ) Notice: Subject to any disclaimer, the term of this patent is extended or adjusted under 35 U.S.C. 154(b) by 670 days.

(21) Appl. No.: 13/687,258

(22) Filed: Nov. 28, 2012

(65) Prior Publication Data

US 2013/0146749 A1    Jun. 13, 2013

(30) Foreign Application Priority Data

Dec. 2, 2011   (DE) ...................... 10 2011 120 099

(51) Int. Cl.
*H01L 27/148*   (2006.01)
*H04N 5/378*    (2011.01)

(52) U.S. Cl.
CPC ........... *H01L 27/148* (2013.01); *H04N 5/378* (2013.01)

(58) Field of Classification Search
CPC .... H04N 5/335; H04N 1/46; H01L 27/14609; H01L 27/249
USPC .... 250/208.1, 214 R, 214.1, 214 C, 214 SW, 250/214 LS; 348/307–309
See application file for complete search history.

(56) References Cited

U.S. PATENT DOCUMENTS

| | | | | |
|---|---|---|---|---|
| 4,593,320 A | * | 6/1986 | Nishizawa | ........... H04N 3/1512 257/258 |
| 5,060,245 A | | 10/1991 | Nelson | |
| 5,153,731 A | | 10/1992 | Nagasaki et al. | |

(Continued)

FOREIGN PATENT DOCUMENTS

| DE | 236199 A1 | 5/1986 |
|---|---|---|
| EP | 1 962 493 A2 | 8/2008 |

(Continued)

OTHER PUBLICATIONS

Adaptive Multiple-Resolution CMOS Active Pixel Sensor by Evgeny Artyomov and Orly Yadid-, Senior Member, IEE, IEEE Transactions on Circuits and Systems-I:Regular Papers, vol. 53, No. 10, Oct. 2006.

(Continued)

*Primary Examiner* — Kevin Pyo
*Assistant Examiner* — Don Williams
(74) *Attorney, Agent, or Firm* — Dinsmore & Shohl LLP

(57) ABSTRACT

An image sensor, in particular a CMOS image sensor, for electronic cameras includes a plurality of light-sensitive pixels arranged in rows and columns for generating exposure-dependent pixel signals. A plurality of column lines, at least one precharge circuit for charging or discharging the column lines and at least one column readout circuit for reading out the pixel signals of the respective column are associated with a respective column. The image sensor has at least one switching device which is adapted to couple, in a first switch state, one of the column lines of a respective column to the precharge circuit and another one of the column lines of the respective column to the column readout circuit.

21 Claims, 9 Drawing Sheets

(56) References Cited

U.S. PATENT DOCUMENTS

Figure 1:
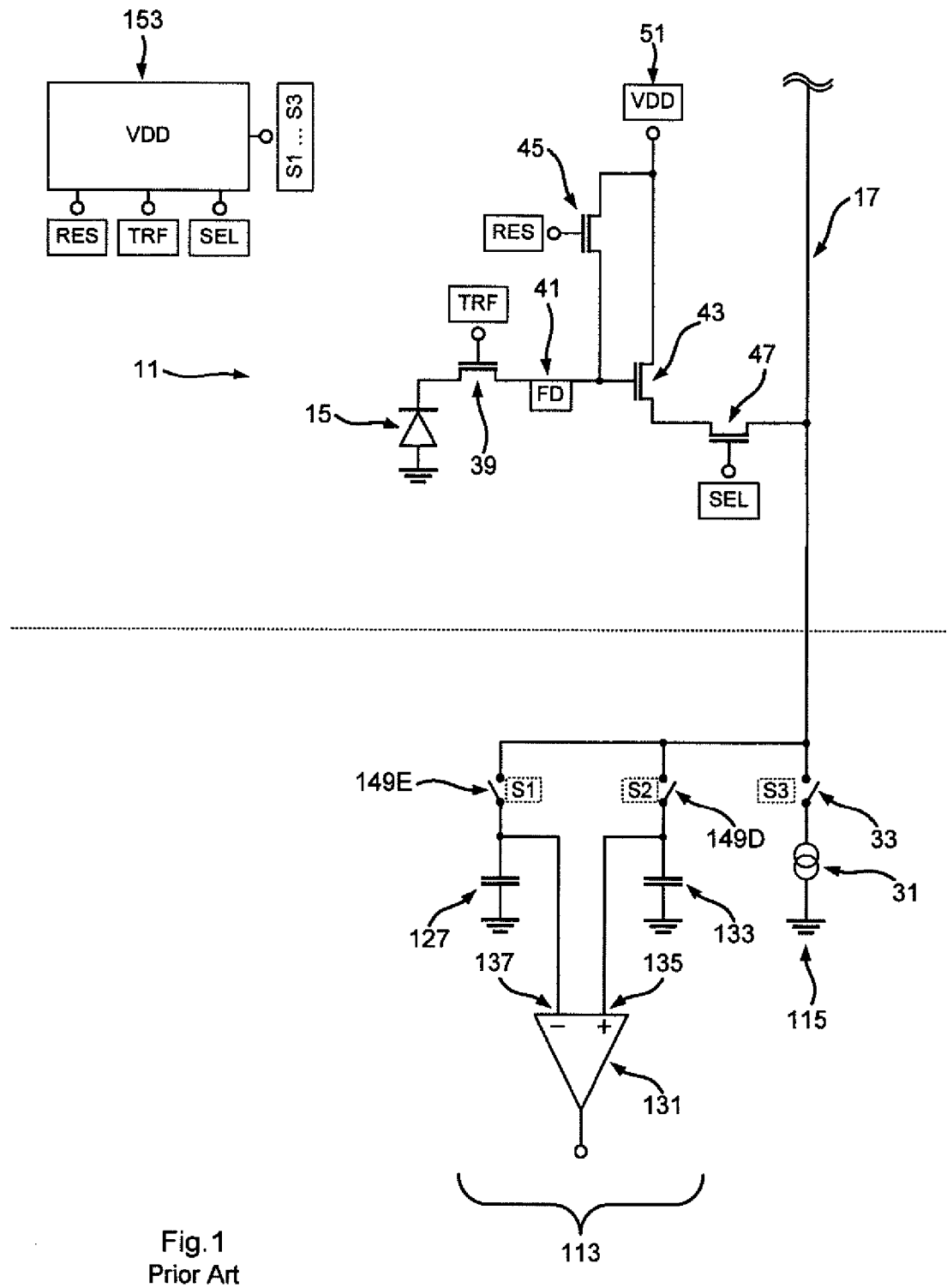

| | | |
|---|---|---|
| 5,412,422 A | 5/1995 | Yamada et al. |
| 5,631,704 A | 5/1997 | Dickinson et al. |
| 5,663,761 A | 9/1997 | Fukui |
| 5,764,289 A | 6/1998 | Fukui |
| 5,786,588 A | 7/1998 | Takahashi |
| 5,836,007 A | 10/1998 | Clinton et al. |
| 5,872,470 A | 2/1999 | Mallinson et al. |
| 5,896,172 A | 4/1999 | Korthout et al. |
| 6,166,768 A | 12/2000 | Fossum et al. |
| 6,201,248 B1 | 3/2001 | Marion et al. |
| 6,567,571 B1 | 5/2003 | Kochi et al. |
| 6,822,213 B2 | 11/2004 | Stark |
| 6,881,946 B2 | 4/2005 | Cok et al. |
| 6,963,372 B1 | 8/2005 | Hiyama et al. |
| 6,953,923 B2 | 10/2005 | Yang et al. |
| 6,982,403 B2 | 1/2006 | Yang et al. |
| 7,019,277 B2 | 3/2006 | Scott-Thomas |
| 7,106,915 B2 | 9/2006 | Dierickx |
| 7,133,073 B1 | 11/2006 | Neter |
| 7,154,548 B2 | 12/2006 | Liu |
| 7,202,462 B2 | 4/2007 | Gomi |
| 7,221,397 B1 | 5/2007 | Kochi |
| 7,244,921 B2 | 7/2007 | Mabuchi |
| 7,268,814 B1 | 9/2007 | Pain et al. |
| 7,324,144 B1 | 1/2008 | Koizumi |
| 7,368,698 B2 | 5/2008 | Altice |
| 7,488,928 B2 * | 2/2009 | Krymski ............ H04N 3/155 250/208.1 |
| 7,538,304 B2 | 5/2009 | Ladd |
| 7,565,033 B2 | 7/2009 | Hanson et al. |
| 7,570,293 B2 | 8/2009 | Nakamura |
| 7,652,703 B2 | 1/2010 | Panicacci |
| 7,719,583 B1 | 5/2010 | Lee et al. |
| 7,728,894 B2 | 6/2010 | Chou |
| 7,777,798 B2 | 8/2010 | Mabuchi |
| 7,932,752 B2 | 4/2011 | Ohba |
| 7,948,540 B2 | 5/2011 | Ogura et al. |
| 7,952,629 B2 | 5/2011 | Cieslinski |
| 7,973,835 B2 | 7/2011 | Sakurai et al. |
| 8,045,031 B2 | 10/2011 | Cieslinski |
| 8,154,637 B2 | 4/2012 | Cieslinski |
| 8,212,904 B2 | 7/2012 | Ishimoto et al. |
| 8,248,501 B2 | 8/2012 | Cieslinski |
| 8,294,187 B2 | 10/2012 | Parks |
| RE44,523 E * | 10/2013 | Scott-Thomas ........... 250/214 R |
| 2003/0223003 A1 | 12/2003 | Meynants |
| 2008/0122962 A1 | 5/2008 | Shah |
| 2008/0135895 A1 | 6/2008 | Lee et al. |
| 2008/0258042 A1 | 10/2008 | Krymski |
| 2009/0002085 A1 | 1/2009 | Tarng et al. |
| 2009/0147089 A1 | 6/2009 | Tonkikh |
| 2009/0273694 A1 | 11/2009 | Krymski |
| 2010/0072350 A1 | 3/2010 | De Wit et al. |
| 2010/0110254 A1 | 5/2010 | Mo et al. |
| 2010/0171122 A1* | 7/2010 | Eguchi .............. H01L 27/14603 257/66 |
| 2010/0271517 A1 | 10/2010 | De Wit et al. |
| 2010/0283878 A1 | 11/2010 | Lin |
| 2011/0128797 A1* | 6/2011 | Hong ...................... G11C 7/02 365/189.05 |
| 2011/0234871 A1 | 9/2011 | Taruki et al. |
| 2012/0062772 A1 | 3/2012 | Osawa et al. |
| 2012/0062773 A1 | 3/2012 | Cieslinski |
| 2012/0119065 A1 | 5/2012 | Cieslinski |

FOREIGN PATENT DOCUMENTS

| | | |
|---|---|---|
| EP | 2093997 A2 | 8/2009 |
| GB | 2 426 883 A | 12/2006 |
| GB | 2 457 716 A | 8/2009 |
| JP | 04010569 A | 1/1992 |
| JP | 11266400 A | 9/1999 |
| JP | 2003309770 A | 10/2003 |
| WO | 99/16238 A1 | 4/1999 |
| WO | 02/056581 A1 | 7/2002 |
| WO | 2007/135158 A1 | 11/2007 |

OTHER PUBLICATIONS

Translation of German Search Report dated Aug. 2, 2012 relating to German Patent Application No. 10 2011 120 099.5.
Translation of European Search Report EP 12 194 668.5 dated Oct. 23, 2013.

* cited by examiner

IMAGE SENSOR AND METHOD OF READING OUT AN IMAGE SENSOR

The present invention relates to an image sensor, in particular a CMOS image sensor, for electronic cameras, having a plurality of light-sensitive pixels arranged in rows and columns for producing exposure-dependent pixel signals, wherein a plurality of column lines, at least one precharge circuit for charging or discharging the column lines and at least one column readout circuit for reading out the pixel signals of the respective column are associated with a respective column. The invention furthermore relates to a method of reading out of an image sensor.

An electronic camera is used, for example, to digitally record image sequences which are later shown in a cinema. It is advantageous in this respect if this camera also has a high frame rate, i.e. a high frame repetition rate, in addition to high light sensitivity and dynamics. This is in particular important for shots which should later be played back in slow motion. A further application in which very high frame rates are required is, for example, the taking of automobile crash tests.

The image sensor of such a camera in this respect converts light incident through the objective of the camera into electrical signals and comprises a plurality of light-sensitive elements, the so-called pixels, which are usually arranged in rows and columns and form the image field. Image sensors manufactured on a silicon base in CMOS or CCD technology are typically used.

To read out an image taken by the camera, the pixels are addressed row-wise, for example, and a voltage proportional to the charge of the respective pixel is generated which is conducted to an output of the image sensor. The pixels arranged in a respective column are associated with at least one common column line and can be selectively connected thereto. The column lines (also called "bit lines") form the so-called column bus and conduct the signals of the pixels to column readout circuits which are arranged at the margin of the image field and which include, for example, column gain circuits and/or signal processing circuits.

A precharge circuit serves for charging or discharging (also known as precharge) the column lines to a predefined value, in particular before an exposure-dependent pixels signal (in particular a voltage value) is output via the respective column line. The column lines are, for example, for this purpose connected at times, in particular directly before the reading out of a respective pixel, and/or continuously by a reference potential, for example a ground potential.

In such an image sensor, the frame rate is substantially limited by two factors, namely by the throughput rate of the column bus and by the throughput rate of the signal readout circuits provided at the margin of the image field. The duration of charge transfers within the pixels can also disadvantageously influence the readout speed and thus the frame rate. The throughput in the signal processing can be increased in that a plurality of signal processing circuits working in parallel are associated with respective groups of column lines. It is, however, more difficult to increase the throughput rate of the column bus. There is, for example, the possibility to divide the column lines in the middle and to read out the upper portion of the image field via signal readout circuits provided at the upper image margin, whereas the lower portion of the image field is read out via signal readout circuits provided at the lower image margin.

It is furthermore possible to associate two or even pour parallel column lines connected to a respective column readout circuit with a column, with the pixel signals of two or four different rows then being able to be read out simultaneously using said column lines. However, these lines cover a part of the light-sensitive surface of the pixel and thus reduce the light sensitivity. Limits are therefore set on a further increase in the number of parallel column lines.

A further disadvantage is the high space requirement for the column readout circuits. For example, each column readout circuit in an image sensor having a pixel size of 5 µm×5 µm requires an area of approximately 5 µm×800 µm. With an image sensor which has four parallel column lines per column, four column readout circuits have to be provided for each column and have to be able to be arranged in series above and/or beneath the image field in an extension of the column lines for space reasons. The space requirements going beyond the actual image field in an image sensor having centrally divided column lines and having signal processing circuits provided at the upper and lower image margins amount to 3.2 mm at each side of the image field, that is to 6.4 mm in total. The increase in size of the chip surface associated therewith increases the manufacturing costs of the sensor. In addition, the yield in chip production is reduced due to the large surface since with an assumed constant defect density a defect becomes more and more probable as the chip surface increases.

As a further problem, on the use of a plurality of parallel column lines, crosstalk takes place between individual parallel column lines, in particular adjacent column lines. Since namely the column lines run over a relatively long distance directly next to one another, they have a high capacitive coupling. The crosstalk which arises due to this capacitive coupling results in artifacts in the image.

The coupling can be avoided if additional lines for shielding are laid between the column lines and are preferably connected to a defined potential of the sensor. Whereas a shielding is still possible with a sensor having two parallel column lines per column, the shadowing accompanying the arrangement of additional shielding lines with sensors having four or more column lines per column results in a reduction of the light-sensitive area of the pixels, and thus in a reduction in the light sensitivity, which can no longer be tolerated.

It is therefore the object of the invention to provide an image sensor and a method of the explained kind which allow the taking of images at a high frame rate without any substantial losses in the light sensitivity.

This object is satisfied by an image sensor in which at least one switching device is associated with the respective column and is adapted to couple one of the column lines of the respective column to the precharge circuit and another one of the column lines of the respective column to the column readout circuit in a first switch state.

Since therefore only one precharging process takes place on the one column line, while a readout process takes place on the other column line, crosstalk based on capacitive coupling between the directly or indirectly adjacent column lines and thus the arising of corresponding artifacts is largely precluded. It is thus possible to arrange the column lines relatively close to one another and in particular without an additional shielding line disposed therebetween on the image sensor. The precharge circuit can include, for example, a current source or a reference potential source.

The switching device can generally be designed in various manners. In the simplest case, this can include a multiway switch which, on the change of the switch state, swaps the respective connection of the first column line and of the other column line, on the one hand, with the column readout circuit and the precharge circuit, on the other hand. In principle, the switching device can, however, also include two toggle switches, for example, or four individual switches which are controlled in a suitable manner to establish the respective switch states. The control of the switching device can take place, for example, in that the image sensor has a control device which is adapted to controlling the switching device, in particular via a common control line for a plurality of switches of the switching device.

In accordance with a preferred embodiment, the switching device is adapted, in a second switch state, to couple said one of the column lines to the column readout circuit or to a further column readout circuit of the respective column (or of another column) and to couple said other one of the column lines to the precharge circuit or to a further precharge circuit of the respective column (or of another column). The switching device can in particular alternate between the two switch states. It is thus in particular possible to reduce the number of required column readout circuits. Whereas with conventional image sensors the charging or discharging of the column lines by means of the precharge circuit and the readout of the pixels associated with the column lines takes place alternately and simultaneously for all column lines, it is possible by the above-described alternate connection of the column lines to the column readout circuit and to the precharge circuit by means of the switching device to read out the pixel signals over a portion of the column lines of the respective column, while another portion of the column lines is at the same time charged or discharged. Said control device can in particular be adapted to control the switching device such that the switching device alternates between the first switch state and the second switch state for the readout of different pixel signals of the respective column, i.e. a switchover takes place for different pixels within the respective column.

Only half as many column readout circuits are thus required with respect to a comparable conventional image sensor in which a separate column readout circuit is associated with each column line The surface requirement for the image sensor chip is thereby reduced. Conversely, this means that with a given area which is available for the column readout circuits a higher throughput rate of the present column readout circuits and thus a higher frame rate can be achieved. In addition, the risk of crosstalk between adjacent column lines, in particular with columns having two column lines, is reduced, but also—as will be explained in the following—with columns having more than two column lines when the column lines are arranged in a suitable manner.

In accordance with an advantageous embodiment, four column lines are associated with a respective column, namely two first column lines and two second column lines. A respective portion of the pixels of this column is connected or connectable (via a row selection switch) to one of the four column lines. In said first switch state of the switching device, the two first column lines are coupled to the at least one precharge circuit and the two second column lines are coupled to the at least one column readout circuit, and in said second switch state of the switching device, the two first column lines are coupled to the at least one column readout circuit and the two second column lines to the at least one precharge circuit. In this embodiment, a pair-wise switchover thus takes place between the precharge of the column lines and the readout of the pixel signals.

It is preferred in this embodiment with four column lines if at least one first precharge circuit and one second precharge circuit, a first column readout circuit and a second column readout circuit as well as a first switching device and a second switching device are associated with the respective column, with the first precharge circuit, the first column readout circuit and the first switching device being arranged at a first end of the respective column and with the second precharge circuit, the second column readout circuit and the second switching device being arranged at a second end of the respective column disposed opposite the first end. The precharge circuits, the column readout circuits and the switching devices are thus provided at both sides of the image field so that the available surface of the image sensor can be ideally utilized.

Provision can be made to utilize the first column readout circuit and the second column readout circuit to achieve a high frame rate that, for example in the first switch state of the first switching device and of the second switching device of the respective column, the one of the two second column lines is coupled to the first column readout circuit and the other one of the two second column lines is coupled to the second column readout circuit, whereas in the second switch state of the first switching device and of the second switching device of the respective column, the one of the two first column lines is coupled to the first column readout circuit and the other one of the two first column lines is coupled to the second column readout circuit (or vice versa naturally).

The precharge circuit preferably has a cut-off switch to be able to cut off the column line connected to the precharge circuit from a current source of the precharge circuit independently of the switching device. It is thereby possible to control the charge process or the discharge process of the one column line independently of the time interval in which the other column line of the respective column is connected to the column readout circuit for reading out a pixel signal.

In order to be able to maintain the respective column line at a reference potential after a charge process or a discharge process, said precharge circuit or a further precharge circuit can have a reference potential source and a second cut-off switch which is arranged between the switching device and the reference potential source. The reference potential source is preferably arranged in parallel with said current source and the associated cut-off switch.

The switching time interval during which a respective column line is coupled to the column readout circuit and the switching time interval during which the respective column line is coupled to the precharge circuit are preferably of equal length. Although the time duration which is required for reading out the pixel signal of a pixel connected to the column line is as a rule longer than the time duration which is required for a discharge or charge of the column line, switching times of equal length make it possible to configure the switching device and its control in a particularly simple manner. The extension of the switching time resulting therefrom during which the precharge circuit is coupled to the column line can be accepted in this respect since a switchover to the next switch state can anyway only take place when the readout process has been completed.

In accordance with an advantageous embodiment, for example when two column lines are associated with the respective column, said one of the column lines of the respective column and said other one of the column lines of the respective column run directly next to one another without a shielding line running between the two column lines. This is possible since, for example in the first switch state, the one column line is coupled to the precharge circuit and thus does not interfere with the signal on the other column line. The use of space in the row direction is thereby reduced and a large light-sensitive surface is available in comparison with an image sensor with a shielding line present between adjacent column lines.

In accordance with a further advantageous embodiment, for example when four column lines are associated with the respective column, some or all of the column lines of the respective column run next to one another, for example within one plane or also in a plurality of planes. In this embodiment, a column line which is coupled to the precharge circuit in this switch state runs between two column lines which are coupled to the column readout circuit in a specific switch state of the switching device (e.g. the first or second switch state). The column lines are accordingly arranged so that alternately one column line is always coupled to the column readout circuit and the directly adjacent column line is coupled to the precharge circuit. The capacitive coupling between the column lines which are coupled to the column readout circuit in a specific switch state is thereby reduced and thus also the crosstalk between these column lines.

In accordance with a further advantageous embodiment, at least four column lines are associated with the respective column which run, viewed in the transverse direction (i.e. along a normal, plane to the direction of extent of the column lines) in pairs next to one another and over one another (i.e. in a 2×2 matrix). In this embodiment, those column lines which are coupled to the column readout circuit in a specific switch state of the switching device (e.g. the first or second switch state) are arranged diagonally adjacent to one another and those column lines which are coupled to the precharge circuit in this switch state are likewise arranged, in a manner complementary hereto, diagonally adjacent to one another. Such an arrangement of four column lines, on the one hand, minimizes the loss of light-sensitive image sensor area and simultaneously also the crosstalk between those column lines which are simultaneously coupled to a column readout circuit. Optionally, however, a respective shielding line can additionally be provided between two vertical and/or horizontal column line pairs. Furthermore, the explained arrangement principle can also be implemented for more than four column lines of a respective column (e.g. in a 3×2 matrix or in a 4×2 matrix).

In accordance with a further advantageous embodiment, the image sensor includes a control device (in particular the already named control device) which controls the image sensor (in particular the charge transfer switches within the pixels, the line selection switches and the column readout circuits) as follows: A plurality of readout steps are carried out in a first one of the pixels of the respective column for a single exposure process of the image sensor in order to generate a plurality of pixel signals of the first pixel after one another and to output them to one of the column lines of the respective column (e.g. reference value and signal value, or first signal value and second signal value). A plurality of readout steps are also carried out in a second one of the pixels of the respective column for the same exposure process in order to generate a plurality of pixel signals of the second pixel after one another and to output them to the same column lines. At least one readout step of the second pixel is carried out between the readout steps of the first pixel. In other words, the plurality of readout steps do not take place directly after one another in one pixel for a single exposure process, but rather alternately with the readout steps of a another pixel which is or can be connected to the same column line. Delays can thus be avoided which can, for example, result from the required time duration for charge transfers within the pixels and which would limit the throughputs of the column bus.

The present invention also relates to a method of reading out an image sensor, in particular a CMOS image sensor, for electronic cameras, which includes a plurality of light-sensitive pixels arranged in rows and columns, with exposure-dependent pixel signals being generated in said pixels and with a plurality of column lines being associated with a respective column. The method is characterized in that another one of the column lines of the respective column is charged or discharged using a precharge circuit within a switching time interval in which one of the pixel signals is output via one of the column lines of a respective column.

Said one of the column lines is preferably charged or discharged using a precharge circuit or said precharge circuit within another switching time interval in which another pixel signal is output via said other one of the column lines.

Further advantageous embodiments of the invention are set forth in the dependent claims, in the description and in the drawings.

Figure 2:
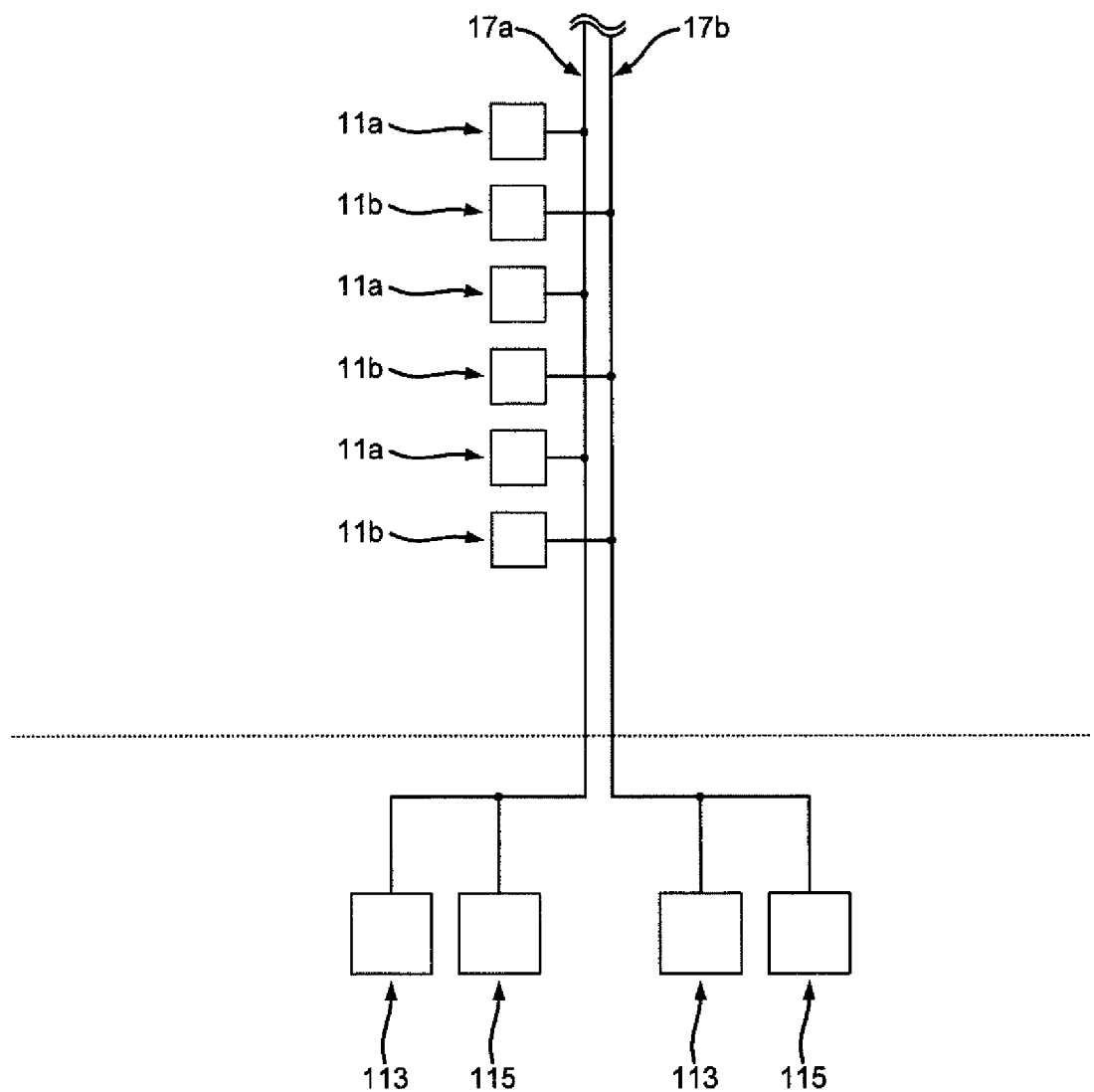
Figure 3:
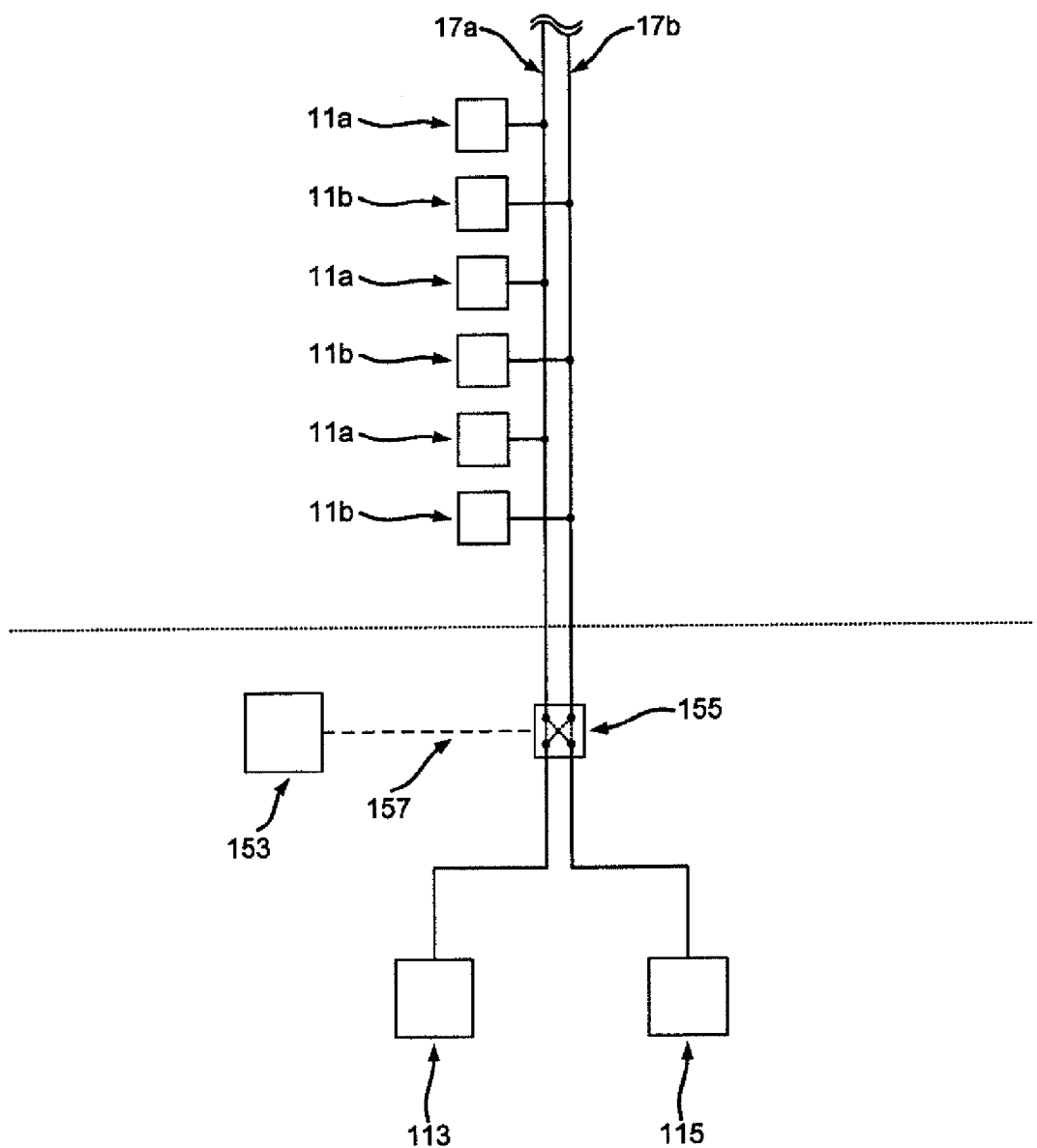
Figure 4:
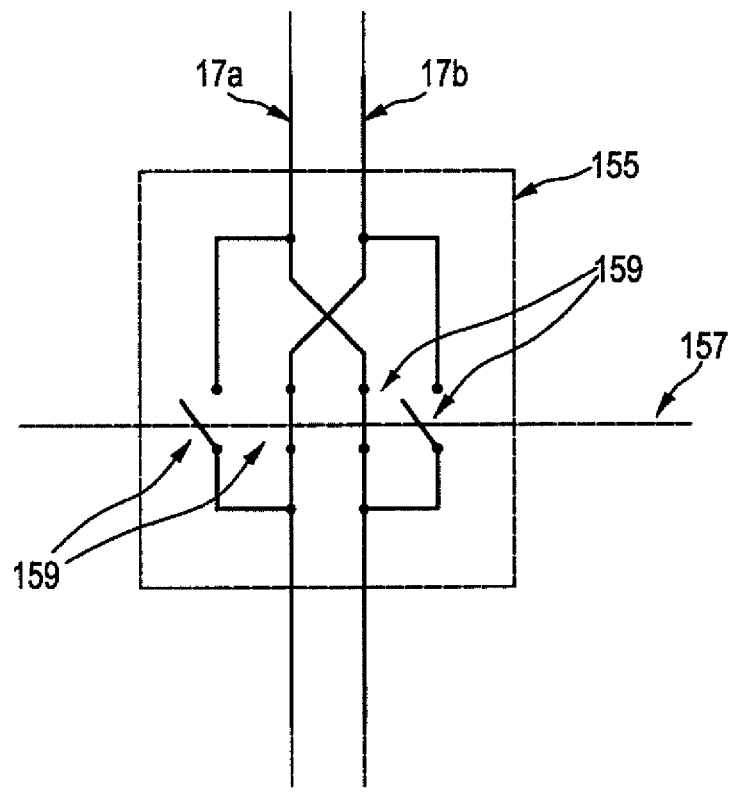
Figure 5:
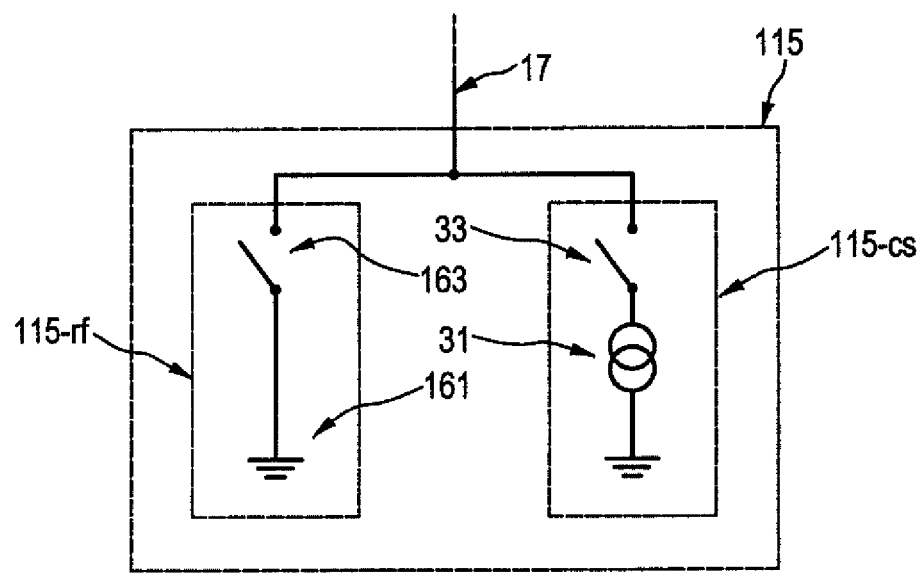
Figure 6A:
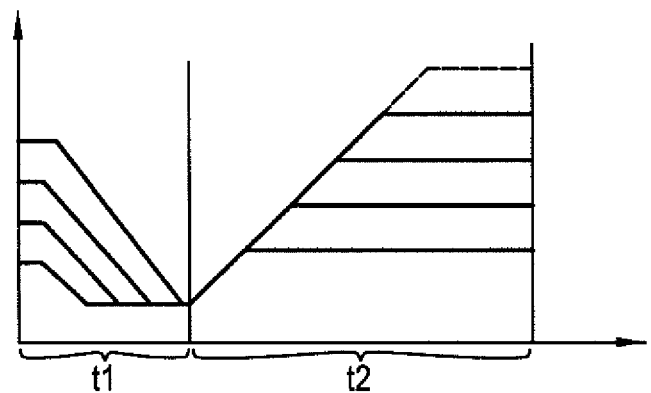
Figure 6B:
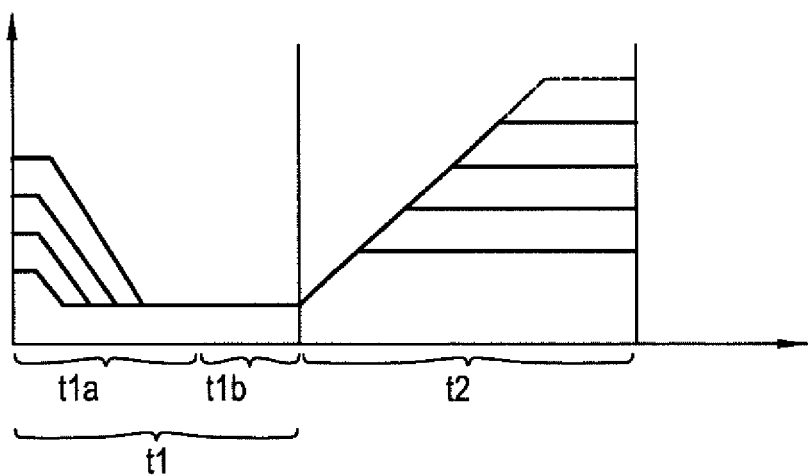
Figure 7A:
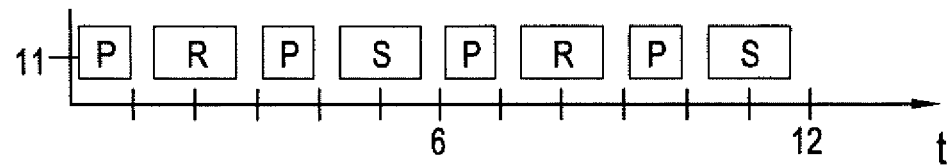
Figure 7B:
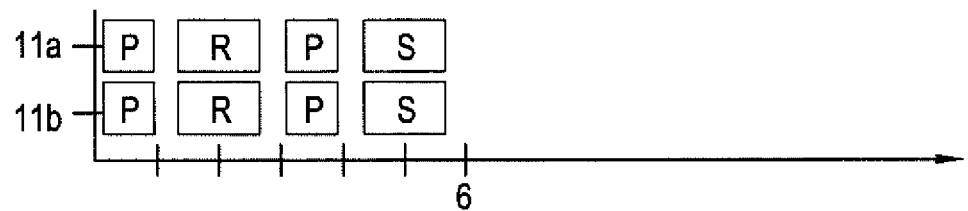
Figure 7C:
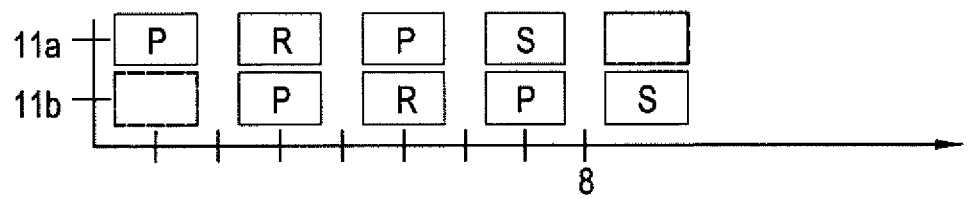
Figure 8:
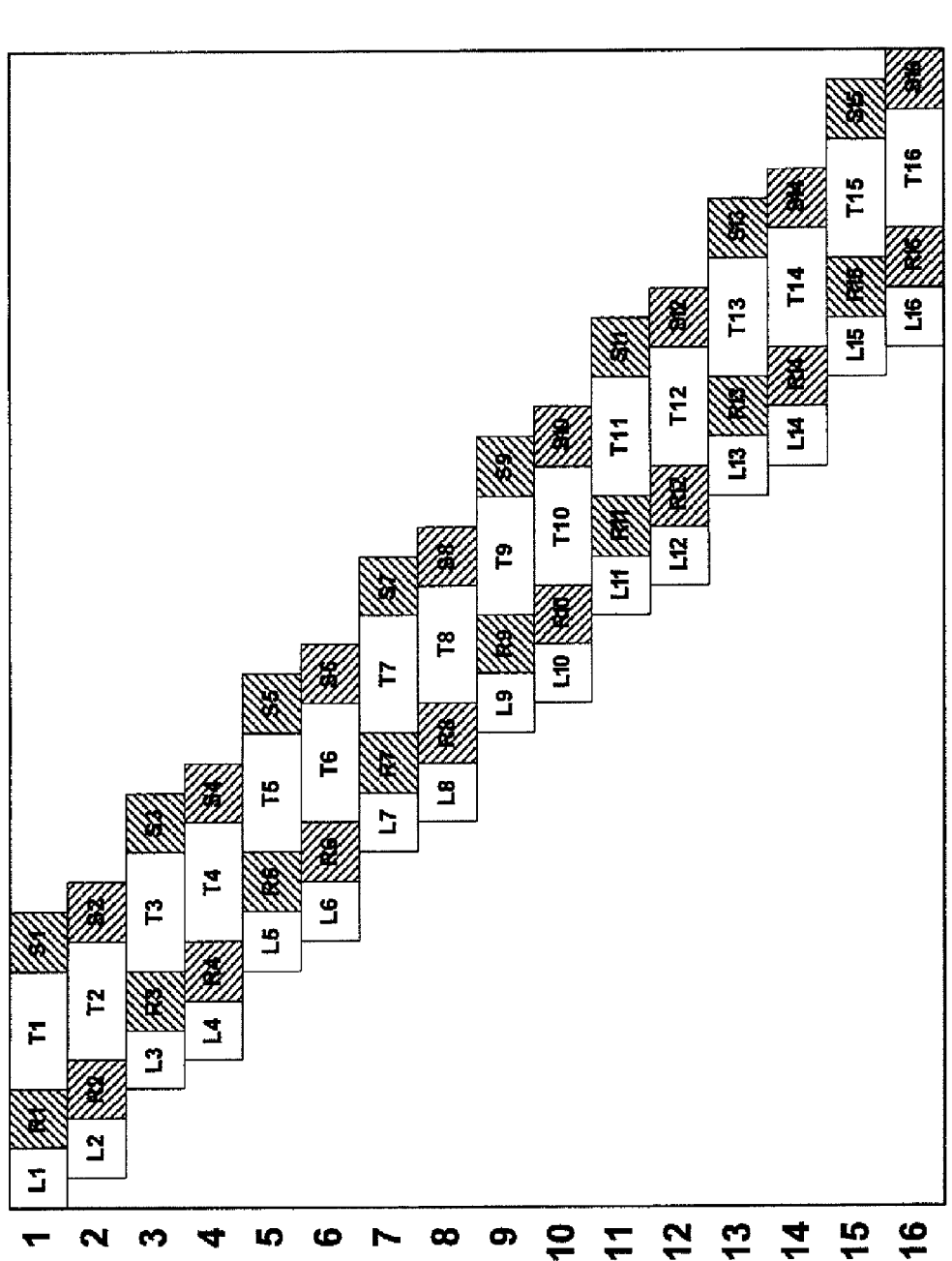
Figure 9:
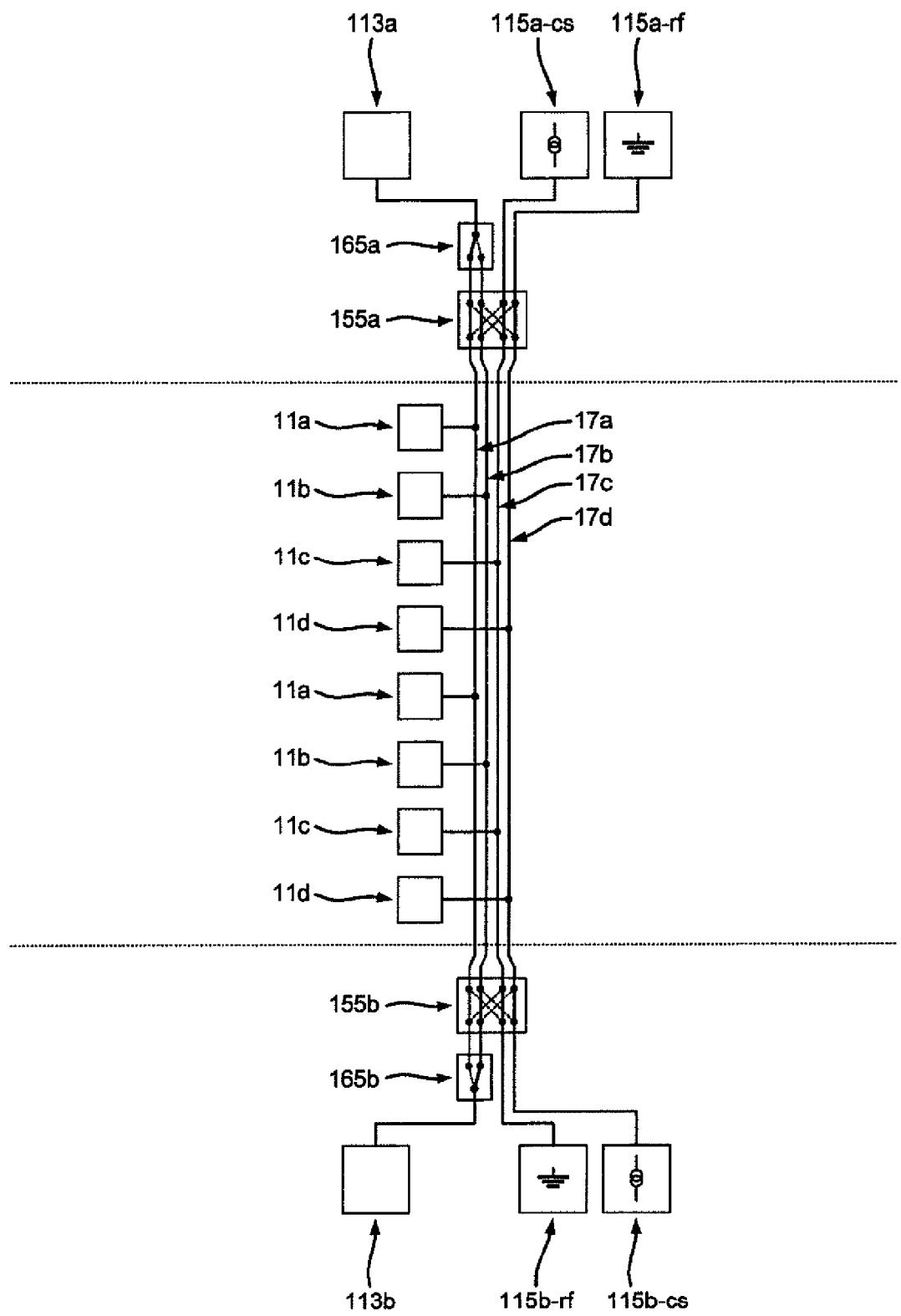
Figure 10A:
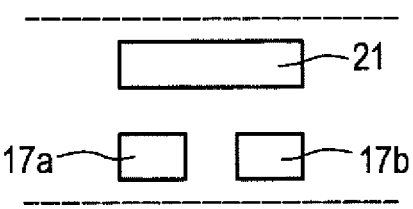
Figure 10B:
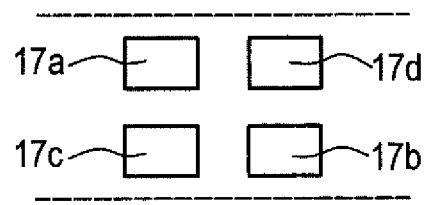

The invention will be described in the following with reference to an embodiment and to the drawings. There are shown:

FIG. 1 a four-transistor CMOS image sensor in accordance with the prior art, with only one pixel and one column readout circuit associated with the column line of the pixel and one precharge circuit being shown of the image sensor;

FIG. 2 a schematic representation of a CMOS image sensor with two column lines per column, with only one portion of a column, including associated column readout circuits and precharge circuits, of the image sensor being shown;

FIG. 3 a schematic representation of a CMOS image sensor in accordance with the present invention in a representation analog to FIG. 2;

FIG. 4 an embodiment of a switching device;

FIG. 5 an embodiment of a precharge device;

FIG. 6A the time potential extent on a column line of an image sensor in accordance with FIG. 1 or 2;

FIG. 6B the time potential extent on a column line of an image sensor in accordance with the invention in accordance with FIG. 3 in a representation analog to FIG. 6A;

FIG. 7A a time extent of the reading out of two pixels of a column in an image sensor in accordance with FIG. 1;

FIG. 7B a time extent of the reading out of two pixels of a column in an image sensor in accordance with FIG. 2 in a representation analog to FIG. 7A;

FIG. 7C a second time extent of the reading out of two pixels of a column in an image sensor in accordance with the invention in accordance with FIG. 3 in a representation analog to FIGS. 7A and 7B;

FIG. 8 a time extent of the reading out of sixteen pixels of a column in an image sensor in accordance with the invention in accordance with FIG. 3;

FIG. 9 a schematic representation of a further embodiment of an image sensor in accordance with the invention, with only one column being shown; and FIGS. 10A and 10B schematic cross-sections through various arrangements of column lines of a column in an image sensor i in accordance with the invention.

The basic operation of an exemplary conventional four-transistor image sensor of the APS (active pixel sensor) type will be explained in the following with respect to FIG. 1 for the better understanding of the invention, with individual components of this image sensor also being present in an image sensor in accordance with the invention. The present invention is, however, not generally restricted to active four-transistor image sensors, but can rather also be used in image sensors having fewer or more than four transistors per pixel.

Only a single pixel 11 is shown as representative in FIG. 1 which includes a light-sensitive detector element in the form of a photodiode 15, in particular in the form of a so-called pinned diode, which is charge-coupled via a switching device in the form of a transfer gate 39 to a readout node 41 which is in particular formed as a so-called floating diffusion (FD).

The readout node 41 is connected to the gate of a converter field effect transistor (FET) 43 which is made as a source follower and which represents a charge voltage converter circuit. Furthermore, the readout node 41 is connected to a positive voltage supply 51 via a further switching device in the form of a reset FET 45. One of the two channel connections of the converter FET 43 is likewise connected to the positive voltage supply 51, whereas the other one of the two channel connections of the converter FET 43 is connectable via a selection FET 47 which acts as a row selection switch to a column line 17 associated with the pixel shown, i.e. to an associated electrical connection line of the column bus.

The column line 17 is provided to connect the pixels arranged in an associated column, in particular the pixel 11, to a common column readout circuit 113, for example to a column gain circuit. The column readout circuit 113 includes a first capacitor or reference value capacitor 127 which is connected to ground by a connection and is selectively connectable by the other connection via a switch 149E to the column line 17. The column gain circuit 113 furthermore includes a second capacitor or signal value capacitor 133 which is likewise connected to ground by one connection and is connectable by the other connection via a further switch 149D likewise selectively to the column line 17.

The column gain circuit 113 furthermore includes an amplifier 131 at whose negative input 137 the voltage applied to the first capacitor 127 is applied and at whose positive input 135 the voltage applied to the second capacitor 133 is applied.

The transfer gate 39 is controllable via a control line TRF; the reset FET 45 is controllable via a control line RES; the selection FET 47 is controllable via a control line SEL; the switch 149E is controllable via a control line S1; and the switch 149D is connectable via a control line 32, in each case by a common control device 153 of the image sensor.

A precharge circuit 115 is furthermore associated with the column line 17 and includes a current source 31 which is selectively connectable to the column line 17 using a cut-off switch 33. The control of the cut-off switch 33 takes place by the common control device 153 via a control line S3.

The operation principle of such a pixel 11 will be described in the following by way of example based on 3.3V CMOS technology. This process is also called "correlated double sampling" (CDS). Typically, all pixels in a row can be read out in the same manner and in particular in parallel so that it is sufficient for the description of the readout process only to look at those pixels which are connected to the same column line 17.

First, the light incident during an exposure procedure is converted by the photodiode 15 into electrical charge so that the photodiode 15 fills with electrons. During the exposure process, the control lines TRF, RES and SEL are each maintained at 0 V, i.e. the switches 39, 45, 47 controlled hereby are open.

Before the actual reading out, the cut-off switch 33 is first closed in a step P (precharge) and is then opened again after the column line 17 has been set to a defined reference potential (here: ground potential). Parallel to this, a voltage of 3.3 V is briefly applied to the control line RES to remove charge formed by leakage currents and/or by scattered light from the readout node 41, i.e. to delete the readout node 41. The readout node 41 is therefore set to a reference value defined by the voltage supply 51 (hereinafter called step L). A voltage is thus adapted at the output of the converter FET 43 which corresponds to the charge at the deleted readout node 41.

In a next step R (reading a reference value), a voltage of 3.3 V is applied to the control line SEL so that the selection FET 47 is closed. The switch 149E is additionally closed. The voltage value of the converter FET 43 corresponding to the charge in the readout node 41 is hereby transferred via the selection FET 47 to the column line 17 and thus to the capacitor 127. After the system has undergone transient oscillation, the selection FET 47 is opened again by a corresponding control signal and the capacitor 127 is simultaneously again cut off from the column line 17 by opening the switch 149E.

Subsequently, in a further step P, the column line 17 is again precharged to the defined reference potential by a brief closing of the cut-off switch 33. In parallel with this, a voltage of 3.3 V is briefly applied to the control line TRF to briefly open the transfer gate 39 so that the electrons generated in dependence on the exposure can flow from the photodiode 15 to the readout node 41 (hereinafter called step T).

In a next step S (reading a signal value), the selection FET 47 and the switch 149D are closed. The voltage value of the converter FET 43 corresponding to the charge in the readout node 41 is hereby transferred via the selection FET 47 to the column line 17 and thus to the capacitor 133. After the system has undergone transient oscillation, the capacitor 133 is again cut off from the column line 17 by opening the switch 149D. The selection FET 47 is also opened and the pixel 11 is cut off from the column line 17 by applying 0 V to the control line SEL.

A voltage is now applied to the output of the amplifier 131 which corresponds to the difference of the voltage values stored in the capacitors 127, 133 and thus to the charge quantity generated in the photodiode 15.

Finally, in a further step, a voltage of 3.3 V is briefly applied to the control lines RES and TRF to remove the charge from the readout node 41 and to remove any residual charge from the photodiode 15 so that the next exposure process can again start with a completely "empty" pixel.

These steps are also carried out for the further pixels connected to the respective column line 17.

A further conventional image sensor includes, in accordance with FIG. 2 and unlike the image sensor of FIG. 1, two column lines 17a, 17b for each column. A respective column readout circuit 113 as well as a respective precharge circuit 115 are associated with the column lines 17a, 17b. A plurality of pixels 11a are associated with the column line 17a and a plurality of pixels 11b are associated with the column line 17b, with one pixel 11a and one pixel 11b being respectively alternately arranged in the column. The respective column line 17a, 17b is selectably connectable to one of the associated pixels 11a, 11b, with the row selection switch provided for this purpose (e.g. selection FET 47 in accordance with FIG. 1) not being shown in FIG. 2. The column readout circuits 113 and the precharge circuits 115 are configured analog to the column readout circuit 113 or to the precharge circuit 115 of FIG. 1.

FIG. 3 now shows an image sensor in accordance with the invention in which the association of pixels 11a, 11b to column lines 17a, 17b corresponds to the conventional image sensor of FIG. 2. The pixels 11a of the shown column are therefore only connectable to the one column line 17a and the pixels 11b are only connectable to the other column line 17b via said row selection switches.

Unlike FIG. 2, only one column readout circuit 113 and one precharge circuit 115, which can be configured as in FIG. 1, for example, are provided for the two column lines 17a, 17b of the respective column. In this respect, the column lines 17a, 17b are connectable to the column readout circuit 113 and to the precharge circuit 115 via a switching device 255 which is shown in simplified form as a multiway switch in this embodiment. The functionality of this multiway switch can alternatively also be provided by a corresponding arrangement of two toggle switches or four single switches which are controlled in a corresponding manner. The control of the switching device 155 takes place via a control line 157 by the control device 153 already explained with respect to FIG. 1.

In a first switch state, the column line 17a can be connected to the precharge circuit 115 and the column line 17b can be connected to the column readout circuit 113 using the switching device 155 (multiway switch state in FIG. 3). In a second switch state, the connections are swapped over, i.e. the column line 17a is connected to the column readout circuit 113 and the column line 17b is connected to the precharge circuit 115 (parallel switch stage in FIG. 3).

Since only one precharge process thus takes place on the one column line (e.g. 17a), while a readout process takes place on the other column line (e.g. 17b), crosstalk due to capacitive coupling between the directly or indirectly adjacent column lines 17a, 17b is avoided.

FIG. 4 shows a possible embodiment of the switching device 155 in accordance with FIG. 3 (in a multiway switch state) with four single switches 159 which are controlled via a single common control line 157.

FIG. 5 shows a possible embodiment of a precharge circuit 115 of the image sensor in accordance with FIG. 3. The precharge circuit 115 includes a precharge circuit 115-cs and a further precharge circuit 115-rf in a parallel arrangement. The precharge circuit 115-cs and the further precharge circuit 115-rf can be connected via a switching device (not shown) to the same column line 27 or to two different column lines (not shown). The precharge circuit 115-cs includes a current source 31 and a controllable cut-off switch 33 (analog to the precharge circuit 115 in accordance with FIG. 1). The further precharge circuit 115-rf includes a reference potential source 161 and a further controllable cut-off switch 163.

The control device 153 of the image sensor (FIG. 3) is adapted, for coupling a respective column line 17a or 17b (FIG. 3) to the precharge circuit 115, first to close the cut-off switch 33 of the precharge circuit 115-cs and to open the further cut-off switch 163 of the further precharge circuit 115-rf to couple the column line 17a, 17b to the current source 31. The column line 17a, 17b is hereby charged or discharged to the desired electrical potential (reference potential). Then the control device 153 opens the cut-off switch 33 and closes the further cut-off switch 163 to couple the respective column line 17a, 17b to the reference potential source 161. The column line 17a, 17b is hereby maintained at the reference potential. After the end of the desired switching time interval, the control device 153 also opens the further cut-off switch 163 again. Then the control device 153 can control the switching device 155 (FIG. 3) to change the switch state, i.e. to couple the column line 17a or 17b charged or discharged to the reference potential to the column readout circuit 113. Now a pixel signal can be transferred via the respective column line 17a, 17b to the column readout circuit 113 (as explained in connection with FIG. 1, e.g. by a brief closing of the selection FET 47).

The cut-off switches 33 and 163 in accordance with FIG. 5 allow a connection of the respective column line 17a or 17b to the current source 31 and to the reference potential source 161 independently of the switching device 155. Alternatively, in an image sensor in accordance with the invention, the reference potential source 161 and the cut-off switches 33, 163 of the precharge circuit 115 can also be omitted. In this case, the time duration of the precharge is determined solely by the switching device 155.

In FIG. 6A, the time extent of the electrical potential on the column lines 17 or 17a, 17b is shown such as typically occurs in conventional image sensors in accordance with FIG. 1 or 2. During a time period t1 which corresponds to the above-described precharge step P, the potential on the column lines 17, 17a, 17b falls continuously to a reference potential predefined by the ground potential, with the time in which this reference potential is reached depending on the previous output potential on the control lines 17, 17a, 17b. This is illustrated by the curve group which is shown in the left part of FIG. 6A. During a subsequent time period t2 which corresponds to the above-described readout steps R or S, the potential on the column lines 17, 17a, 17b rises to a signal potential which corresponds to the charge present in the readout node 41 (FIG. 1) (again illustrated as a curve group in the right part of FIG. 6A). As a rule, a conventional image sensor is controlled so that the time period t2 (undergoing of transient oscillation of the signal voltage) is longer than the time period t1 (precharge).

An exemplary time curve for an image sensor in accordance with the invention (e.g. in accordance with FIG. 3) is shown in FIG. 6B. This time curve substantially differs from that in accordance with FIG. 6A in that the time period t1 for the precharge step P is of equal length to the time period t2 for the readout steps R or S. The time curve shown relates, for example, to the column line 17a in accordance with FIG. 3. The time period t1 in this case corresponds to a switching time interval in which the switching device 155 adopts the first switch state named in connection with FIG. 3 in which the column line 17a is connected to the precharge circuit 115. The time period t2 in this case corresponds to a switching time interval in which the switching device 155 adopts the second switch state named in connection with FIG. 3 in which the column line 17a is connected to the column readout circuit 113.

It is additionally shown in FIG. 6B that the time period t1 for the precharge step P can furthermore be divided into two precharge intervals t1a, t1b if the precharge circuit 115 includes a precharge circuit 115-cs and a further precharge circuit 115-rf as explained in connection with FIG. 5. In a first precharge interval t1a, the precharge circuit 115-cs (current source 31) is active by a temporary closure of the cut-off switch 33 to charge or discharge the column line (e.g. 17a) to the reference potential. The duration of the first precharge interval t1a can be selected in accordance with the period maximally required for the precharge. In a second precharge interval t1b, the further precharge circuit 115-rf (reference potential source 162) is active by a temporary closing of the further cut-off switch 163 to maintain the column line (e.g. 17a) at the reference potential.

Since the time period t1 for the precharge step P is of equal length to the time period t2 for the readout steps R or S in FIG. 6B, the charging or precharging of the column lines to the reference potential in the image sensor in accordance with the invention extends over a longer time period than with a conventional image sensor. The time period for reading out two pixels is nevertheless substantially shortened in comparison with a conventional image sensor in accordance with FIG. 1 which has one column line and on column readout circuit per column. However, only a slight extension of the corresponding time period results with respect to an image sensor in accordance with FIG. 2 with two column lines with which a respective separate column readout circuit and precharge circuit are associated. This will be explained in more detail in the following with reference to the respective time routines shown in simplified form in FIGS. 7A to 7C which result on the reading out of two pixels of a column.

FIG. 7A shows this time routine for a sensor with only one column line 17 such as was described with reference to FIG. 1. Step P (precharge), step R (reading a reference value) and step S (reading a signal value) are represented by blocks of different lengths which are marked by corresponding symbols P, R and S. The different switching times t1, t2 for step P, on the one hand, and for steps R and S, on the other hand, (FIG. 6A) are illustrated by different lengths of the blocks in the direction of the time axis t. In simplified terms, the relative time unit for step P amounts to one unit, whereas the relative time duration for steps R and S amounts to two time units. Accordingly, the time period for a readout cycle of a pixel, which includes the reading out of a reference value and of a signal value including the associated precharge processes of the column lines, amounts to six time units. Since the two pixels are read out sequentially, a total of twelve time units is required.

In an image sensor in accordance with FIG. 2 with two column lines with which a respective separate column readout circuit and precharge circuit are associated, two mutually adjacent pixels 11a and 11b are read out in parallel. A corresponding time routine is shown in FIG. 7B, with step P and steps R and S each having the same length as in FIG. 7A. The time period for a readout cycle of a pixel accordingly likewise amounts to six time units. Since the two pixels are read out in parallel with one another, a total of only six time units is required. The advantage of the fast reading out is, however, here opposed by the disadvantage of the greater space requirement for the additional column readout circuit and the precharge circuit (column readout circuits 113 and precharge circuits 115 in accordance with FIG. 2).

In FIG. 7C, analog to FIGS. 7A and 7B, the time routine of the reading out is shown for an image sensor in accordance with the invention, for example in accordance with FIG. 3. The time duration for a precharge step P in this respect amounts to two time units just as for a readout step R or S. As can be recognized in FIG. 7C, a precharge step P takes place alternately for the pixels 11a and 11b. Accordingly, a readout step R or S also takes place alternately for the pixels 11a and 11b. Whereas therefore one of the pixels 11a is read out via the column line 17a, the column line 17b connected to one of the pixels 11b is simultaneously precharged by means of the precharge circuit 113 (cf. FIG. 3) and vice versa. A readout cycle for both pixels 11a, 11b, including the required precharge times, thus requires a total of eight time units, with there being a certain interlocking of a respective two time units with one preceding and one following readout cycle of the respective column. The readout cycle for the two pixels 11a, 11b therefore takes somewhat longer than in FIG. 7B. However, for this purpose only one single column readout circuit 113 and one single precharge circuit 115 are required (cf. FIG. 3) with respect to the two column readout circuits 113 and two precharge circuits 115 for each column in accordance with FIG. 2.

FIG. 8 shows a further possible time curve of the reading out of, for example, sixteen pixels of a column in an image sensor in accordance with the invention in accordance with FIG. 3. In this embodiment, two column lines 17a, 17b are associated with the respective column, with the explained principle also being able to be transferred to a higher number of column lines (e.g. four). It is generally only important that a plurality of readout steps are carried out in each of the pixels for a single exposure process (e.g. one reference value and one signal value, or a first signal value and a second signal value). In FIG. 8, the sixteen pixels (i.e. rows) of the respective column on the left side and additionally in the different steps are marked by the numbers 1 to 16. Due to the alternating connection of the pixels to the two column lines 17a, 17b in accordance with FIG. 3, it results that the pixels marked by odd numbers in FIG. 8 (1, 3, 5, . . . ) are connected to the one column line 17a and the pixels marked by even numbers (2, 4, 6, . . . ) are connected to the other column line 17b.

Steps L and T are shown in FIG. 8 in addition to step R (reading a reference value) and step S (reading a signal value). Step L designates a deletion of the readout node 41 of the respective pixel, as explained in connection with FIG. 1. Step T designates a transferring of the charge generated in dependence on the exposure from the photodiode 15 to the readout node 41 of the respective pixel. This pixel-internal transfer of the charge as a rule requires a time duration which is longer than the time duration required for the respective steps L, R and S. If the time duration for the charge transfer is selected as too short, only an incomplete transfer takes place, which results in image artifacts. In this respect, in the example shown for FIG. 8, one work cycle is provided for each of the steps L, R and S, whereas two work cycles are provided for the transfer step T. This is shown in FIG. 8 (in a similar manner as in FIG. 7C) by blocks of different lengths.

For better clarity, the respective step P in accordance with FIG. 7C, that is the precharge of the column line 17a, 17b prior to the actual reading out of the reference value or of the signal value, is not shown in FIG. 8. Instead, the shown respective step R in the manner of illustration in accordance with FIG. 8 includes in the first half the precharge of the column line 17a or 17b and in the second half the reading of the reference value via this column line 17a, 17b. The shown respective step S includes the precharge in the first half and the reading of the signal value in the second half.

A special feature of the time curve of the reading out of the sixteen pixels shown in FIG. 8 is that, on the one hand, a sufficiently long time duration is provided for the charge transfer within the respective pixel (step T) and that, on the other hand, the time period required in total for reading out all pixels is kept short by an interlocking of the readout steps carried out for different pixels. A high frame rate is thus made possible.

For this purpose, the control device 153 controls the image sensor such that a plurality of readout steps (step R and step S including the respective precharge of the associated column line) are carried out for a single exposure process of the image sensor in a first of the pixels to generate a plurality of pixel signals of the first pixel after one another and to output them to one of the two column lines 17a or 17b. Furthermore, a plurality of readout steps (R and S) are also carried out for the same exposure process in a second one of the pixels to generate a plurality of pixel signals of this second pixel after one another and to output them to the same one of the two column lines 17a, 17b. In this respect, the control device 153 provides that at least one readout step of the second pixel is carried out between the readout steps of the first pixel.

For example, in accordance with FIG. 8, the following sequence of readout steps is provided for the pixels connected to the column line 17a (FIG. 3) (pixels designated by odd numbers): R1, R3, S1, R5, S3, R7, S5, R9, S7, R11, S9, etc. Steps L (deleting the readout node) and T (transferring the change to the readout node) can also be carried out between the readout steps R, S in the pixels, as shown in FIG. 8.

It is of particular advantage that the respective column line (17a or 17b) is utilized very efficiently for the interlocked readout steps R, S (including the respective precharge of the associated column line) in accordance with FIG. 8. This becomes clear when observing FIG. 8 along a vertical direction. The occupation of the respective column line 17a, 17b by a readout step R, S is namely illustrated by a hatching of the respective readout step in FIG. 8, with different hatchings being selected for the pixels connected to the one column line 17a and for the pixels connected to the other column line 17b. Apart from the reading out of the first and last rows, the respective column line 17a, 17b is utilized at every point in time, namely for each readout step R, S only for the precharge and then for the transfer of the reference value or of the signal value. In contrast, a double occupation of the respective column line 17a, 17b does not take place at any point in time (cf. the different hatchings). It can also be seen from FIG. 8 that a single precharge circuit 115 and a single column readout circuit 113 are sufficient for the two column lines 17a, 17b by a corresponding control of the switching device 155 (FIG. 3). Only one of the two column liens 17a, 17b namely has to be precharged and only one of the two column lines 17a, 17b has to be read out at any point in time (cf. arrangement of the first halves of the readout steps R, S and arrangement of the second halves of the readout steps R, S).

FIG. 9 shows a further embodiment of an image sensor in accordance with the invention. In this embodiment, four column lines, namely two first column lines 17a, 17b and two second column lines 17c, 17d, are associated with a respective column of pixels 11 (preferably with each column of the image sensor). The pixels 11a are connectable to one (17a) of the two first column lines, the pixels 11b to the other one (17b) of the two first column lines, the pixels 11c with one (17c) of the two second column lines and the pixels 11d to the other one (17d) of the two second column lines. For this purpose, row selection switches are provided (e.g. selection FET 47 in accordance with FIG. 1), which are not shown in FIG. 9. The association of the pixels 11a, 11b, 11c and 11d with the different column lines 17a, 17b, 17c and 17d is preferably selected in accordance with a cyclic order, for example as shown in FIG. 9 or in accordance with another pattern.

A first column readout circuit 113a, a first precharge circuit 115a-cs, a further first precharge circuit 115a-rf and a first switching device 155a are associated with the shown column at a first end of the column (e.g. at an upper margin of the image field). Furthermore, a first selection switch 165a is arranged between the first switching device 155a and the first column readout circuit 113a. A second column readout circuit 113b, a second precharge circuit 115b-cs, a further second precharge circuit 115b-rf and a second switching device 115b are associated with the column at a second end of the column (e.g. at a lower margin of the image field) disposed opposite the first end. Furthermore, a second selection switch 165b is arranged between the second switching device 155b and the second column readout switch 113b.

The control of the switching devices 155a, 155b and of the selection switches 165a, 165b takes place by a control device (not shown in FIG. 9) already explained with reference to FIG. 1, in a similar manner as in FIG. 3. However, the two switching devices 155a, 155b are here active pairwise for the column lines 17a, 17b, 17c, 17d and the two switching devices 155a, 155b are controlled synchronously with one another. This means that in a first switch state of the two switching devices 155a, 155b, the two first column lines 17a, 17b are, for example, coupled to the first and second precharge circuits 115a-cs, 115b-cs at the two ends of the column and that in the first switch state the two second column lines 17c, 17d are coupled to the column readout circuits 113a, 113b (multiway switch state in FIG. 9). The selection switches 165a, 165b are in this respect controlled synchronously with one another such that the one (e.g. 17a) of the two first column lines is naturally only coupled to one of the two column circuits 113a, 113b and the other one (e.g. 17b) of the two first column lines is only coupled to the other one of the two column readout circuits 113a, 113b. In the second switch state of the two switching devices 155a, 155b, the two first column lines 17a, 17b are coupled to the column readout circuits 113a, 113b and the two second column lines 17c, 17d are coupled to the first and second precharge circuits 115a-cs, 115b-cs (parallel switch state in FIG. 9).

Since only a precharge process thus takes place on some column lines (e.g. 17a, 17b), whereas a readout process takes place on the other column lines (e.g. 17c, 17d), crosstalk due to capacitive coupling between the column lines (e.g. between 17a and 17b or between 17a and 17c) is avoided. This in particular applies when the four column lines 17a, 17b, 17c, 17d are arranged as shown in FIG. 10B.

A special feature of the image sensor in accordance with FIG. 9 is also in the (optional) selection switches 165a, 165b, which serve as column line selection switches. The two selection switches 165a, 165b can selectively adopt a first switch state or a second switch state. Said control device controls the two selection switches 165a, 165b synchronously with one another, but independently of the respective switch state of the two switchover circuits 155a, 155b. For example, the first selection switch 165a can either adopt the first switch state or the second switch state, whereas the first switching device 155a adopts the first switch state. The control device changes the respective switch state of the two selection switches 165a, 165b of a respective column in accordance with a regular or irregular switching pattern (e.g. random or quasi-random) for the reading out of different pixels. Each pixel 11 of the column can thus selectively be read out by the first column readout circuit 113a (i.e. upwardly) or by the second column readout circuit 113b (e.g. downwardly).

A stripe pattern in an image taken by the image sensor can hereby be avoided which might otherwise arise in that the properties of the first column readout circuits 113a and the properties of the second column readout circuits 113b differ from one another (for example due to different gain factors induced in the manufacture). A dot pattern is ultimately generated which is hardy or not at all recognizable by the human eye in comparison with a stripe pattern by the varying of the association of the pixels 11 with the first column readout circuit 113a or with the second column readout circuit 113b. The control device can vary the switch state of the two selection switches 165a, 165b, for example between the reading out of pixel signals of the pixels 11 from different rows, and/or between the reading out of pixel signals of the pixels 11 from different images of a sequence of images.

A further special feature of the image sensor in accordance with FIG. 9 is in the (optional) arrangement of the further first and second precharge circuits 115a-rf, 115b-rf at both ends of the respective column. The first precharge circuit 115a-cs and the second precharge circuit 115b-cs include (corresponding to the precharge circuit 115-cs in accordance with FIG. 5) a respective current source and a controllable cut-off switch. The further first precharge circuit 115a-rf and the further second precharge circuit 115b-rf include (in accordance with the further precharge circuit 115-rf in accordance with FIG. 5) a respective reference potential source and a further controllable cut-off switch. The respective column line 17a, 17b, 17c or 17d can hereby first be charged to a reference potential and then maintained at the reference potential, as explained in connection with FIG. 5 and FIG. 6B. As can be seen from FIG. 9, however, the arrangement of the first precharge circuit 115a-cs and of the further first precharge circuit 115a-rf at the first end of the column and the arrangement of the second precharge circuit 115b-cs and of the further second precharge circuit 115b-rf at the second end of the column are swapped over relative to one another. It is hereby sufficient only to provide a current source and a reference potential source at the first end of the column and also only to provide a current source and a reference potential source at the second end of the column.

The arrangement of the first precharge circuits 115a-cs, 115a-rf and of the second precharge circuits 155b-cs, 155b-rf is selected such that in the first switch state of the two switching devices 155a, 155b one (e.g. 17a) of the two first column lines is coupled to the first precharge circuit 115a-cs (current source) at the first end of the column and to the further second precharge circuit 115b-rf (reference potential source) at the second end of the column. The other one (e.g. 17b) of the two first column lines is coupled in this state to the second precharge circuit 115b-cs (current source) at the second end of the column and to the further first precharge circuit 115a-rf (reference potential source) at the first end of the column. The same applies accordingly to the two second column lines 17c-17d in the second switch state of the two switching devices 15a, 155b.

FIGS. 10A and 10B show different arrangements of column lines 17a, 17b in an image sensor. The upper sides and lower sides of the image sensors are each indicated by dashed lines.

In an image sensor in accordance with a first variant (FIG. 10A) each column has a column line pair with column lines 17a and 17b. The column lines 17a, 17b are arranged next to one another in a plane without an interposed shielding line. Optionally, however, a shielding line 21 covering the column lines 17a, 17b can be provided which is preferably connected to a reference potential.

A variant of an image sensor includes, in accordance with FIG. 10B (at least) four column lines 17a, 17b, 17c, 17d which are arranged in a 2×2 matrix pairwise next to one another and over one another (i.e. in two planes). The two column lines 17a, 17b which can in particular correspond to the two first column lines 17a, 17b in accordance with FIG. 9 are thus arranged diagonally adjacent to one another. The column lines 17c, 17d, which can in particular correspond to the two second column lines 17c, 17d in accordance with FIG. 9, are likewise arranged—in a complementary manner hereto—diagonally adjacent to one another. The column lines 17a, 17b, 17c, 17d are coupled to at least one switching device (not shown in FIG. 10B) such that in a first switch state the column lines 17a, 17b are coupled to a respective precharge circuit, whereas the column lines 17c, 17d are coupled to a respective column readout circuit.

In a second switch state, the arrangement is swapped over so that the column lines 17a, 17b are coupled to the respective column readout circuit and the column lines 17c, 17d are coupled to the respective precharge circuit.

Those column lines on which a simultaneous readout of the pixels takes place during a specific switch state are thus always spaced apart from one another in the diagonal direction. The crosstalk is thus reduced due to the greater spacing in comparison with an arrangement in which the column lines via which a readout process takes place simultaneously are arranged directly next to one another or over one another.

REFERENCE NUMERAL LIST 11, 11a, 11b pixels
15 photodiode
17, 17a, 17b column line
21 shielding line
31 current source
33 cut-off switch
39 transfer gate
41 readout node
43 converter FET
45 reset FET
47 selection FET
51 positive supply
113, 113a, 113b column readout circuit
115, 115a, 115b precharge circuit
127 reference value capacitor
131 amplifier
133 signal value capacitor
135 positive input
137 negative input
149D, 149E switches
153 control device
155 switching device
157 control line
159 single switch
161 reference potential source
163 cut-off switch
165a, 165b selection switch

The invention claimed is:

1. An image sensor for electronic cameras,
having a plurality of light-sensitive pixels arranged in rows and columns for generating exposure-dependent pixel signals, wherein a plurality of column lines are associated with each column of said light-sensitive pixels, at least one precharge circuit for charging or discharging the plurality of column lines and at least one column readout circuit for reading out the pixel signals of the respective column are associated with a respective column,
wherein at least one switching device is associated with the plurality of column lines for each respective column of said light-sensitive pixels and said at least one switching device is adapted to couple, in a first switch state, one of said plurality of column lines of the respective column to the at least one precharge circuit and simultaneously another one of said plurality of column lines of the respective column to the at least one column readout circuit, and wherein the at least one switching device is adapted to couple, in a second switch state, the one of the plurality of column lines to the at least one column readout circuit or to a further column readout circuit of the respective column and simultaneously to couple the other one of the plurality of column lines to the at least one precharge circuit or to a further precharge circuit of the respective column.

2. The image sensor of claim 1,
wherein the image sensor has a control device which is adapted to control the at least one switching device such that the at least one switching device alternates between the first switch state and the second switch state.

3. The image sensor of claim 1,
wherein at least one first column line and at least one second column line are associated with the respective column, with a portion of the pixels of the respective column being connected or connectable to the at least one first column line and another portion of the pixels of the respective column being connected or connectable to the at least one second column line;
wherein in the first switch state the at least one first column line is coupled to the at least one precharge circuit and the at least one second column line is coupled to the at least one column readout circuit, and wherein in the second switch state the at least one first column line is coupled to the at least one column readout circuit and the at least one second column line is coupled to the at least one precharge circuit.

4. The image sensor of claim 1,
wherein two first column lines and two second column lines are associated with the respective column, with a portion of the pixels of the respective column being connected or connectable to one of the two first column lines, another portion of the pixels of the respective column being connected or connectable to the other one of the two first column lines, yet another portion of the pixels of the respective column being connected or connectable to one of the two second column lines and yet another portion of the pixels of the respective column being connected or connectable to the other one of the two second column lines;
wherein in the first switch state of the at least one switching device the two first column lines are coupled to the at least one precharge circuit and the two second column lines are coupled to the at least one column readout circuit; and
wherein in the second switch state of the at least one switching device the two first column lines are coupled to the at least one column readout circuit and the two second column lines are coupled to the at least one precharge circuit.

5. The image sensor of claim 1,
wherein the at least one precharge circuit includes at least a first precharge circuit and a second precharge circuit, with the at least one column readout circuit including a first column readout circuit and a second column readout circuit, and wherein the at least one switching device includes a first switchover line and a second switchover line;
wherein the first precharge circuit, the first column readout circuit and the first switching device are arranged at a first end of the respective column, and wherein the second precharge circuit, the second column readout circuit and the second switching device are arranged at a second end of the respective column disposed opposite the first end.

6. The image sensor of claim 5,
wherein the image sensor has a control device which is adapted to control the first switching device and the second switching device of the respective column synchronously with one another.

7. The image sensor of claim 5,
wherein in the first switch state of the first switching device and of the second switching device of the respective column one of the two first column lines is coupled to the first precharge circuit and the other one of the two first column lines is coupled to the second precharge circuit, and wherein in the second switch state of the first switching device and of the second switching device of the respective column one of the two second column lines is coupled to the first precharge circuit and the other one of the two second column lines are coupled to the second precharge circuit.

8. The image sensor of claim 7,
wherein the first precharge circuit has a first current source and a first cut-off switch which is arranged between the first switching device and the first current source, and wherein the second precharge circuit has a second current source and a second cut-off switch which is arranged between the second switching device and the second current source;
wherein the at least one precharge circuit furthermore includes a further first precharge circuit and a further second precharge circuit, with the further first precharge circuit having a first reference potential source and a further first cut-off switch which is arranged between the first switching device and the first reference potential source, and wherein the further second precharge circuit has a second reference potential source and a further second cut-off switch which is arranged between the second switching device and the second reference potential source; and
wherein in the first switch state of the first switching device and of the second switching device of the respective column the one of the two first column lines is coupled to the further second precharge circuit and the other one of the two first column lines is coupled to the further first precharge circuit, and wherein in the second switch state of the first switching device and of the second switching device of the respective column the one of the two second column lines is coupled to the further second precharge circuit and the other one of the two second column lines is coupled to the further first precharge circuit.

9. The image sensor of claim 5,
wherein in the first switch state of the first switching device and of the second switching device of the respective column one of the two second column lines is coupled to the first column readout circuit and the other one of the two second column lines is coupled to the second column readout circuit, and wherein in the second switch state of the first switching device and of the second switching device of the respective column one of the two first column lines is coupled to the first column readout circuit and the other one of the two first column lines is coupled to the second column readout circuit.

10. The image sensor of claim 5,
wherein a first selection switch is arranged between the first switching device and the first column readout circuit, and wherein a second selection switch is arranged between the second switching device and the second column readout circuit, wherein the first selection switch and the second selection switch can adopt a first switch state or a second switch state;
wherein the image sensor has a control device which is adapted to control the first switching device and the second switching device of the respective column synchronously with one another and to control the first selection switch and the second selection switch synchronously with one another, but independently of the first switching device and of the second switching device;
wherein in the first switch state of the first switching device and of the second switching device of the respective column one of the two second column lines is coupled to one of the first column readout circuit and of the second column readout circuit in dependence on the switch state of the first selection switch and of the second selection switch and the other of the two second column lines is coupled to the other one of the first column readout circuit and of the second column readout circuit, and wherein in the second switch state of the first switching device and of the second switching device of the respective column one of the two first column lines is coupled to one of the first column readout circuit and of the second column readout circuit in dependence on the switch state of the first selection switch and of the second selection switch and the other one of the two first column lines is coupled to the other one of the first column readout circuit and of the second column readout circuit.

11. The image sensor of claim 10,
wherein the control device is adapted to change the switch state of the first selection switch and of the second selection switch between the reading out of pixel signals of the pixels of different rows or between the reading out of pixel signals of the pixels of different images of a sequence of images.

12. The image sensor of claim 1,
wherein the switching device has a plurality of switches, with the image sensor having a control device which is adapted to control the plurality of switches of the switching device via a common control line.

13. The image sensor of claim 1,
wherein the at least one precharge circuit has a current source and a cut-off switch which is arranged between the at least one switching device and the current source.

14. The image sensor of claim 13,
wherein the at least one precharge circuit furthermore has a reference potential source and a further cut-off switch which is arranged between the at least one switching device and the reference potential source,
wherein the image sensor has a control device which is adapted, for coupling a respective column line to the at least one precharge circuit, first to close the cut-off switch and to open the further cut-off switch in order to couple the respective column line to the current source and then to open the cut-off switch and to close the further cut-off switch in order to couple the respective column line to the reference potential source.

15. The image sensor of claim 1,
wherein a switching time interval during which a respective column line is coupled to the at least one column readout line and a switching time interval during which a respective column line is coupled to the at least one precharge circuit are of equal length.

16. The image sensor of claim 1,
wherein one of the column lines of the respective column and another one of the column lines of the respective column run directly next to one another without a shielding line running between the two column lines.

17. The image sensor of claim 1,
wherein the plurality of column lines of the respective column run next to one another, with at least one column line which is coupled to the at least one precharge circuit in the first switch state running between two column lines which are coupled in the first switch state of the at least one switching device to the at least one column readout circuit.

18. The image sensor of claim 1,
wherein at least four column lines are associated with the respective column and run pair-wise next to one another and over one another viewed in a transverse direction, with two of the at least four column lines, which are coupled to the at least one column readout circuit in the first switch state of the at least one switching device, being arranged diagonally adjacent to one another, and with the other two of the at least four column lines, which are coupled to the at least one precharge circuit in the first switch state of the at least one switching device, being likewise arranged, in a complementary manner hereto, diagonally adjacent to one another.

19. The image sensor of claim 1,
wherein the image sensor has a control device which is adapted to control the image sensor such that a plurality of readout steps are carried out for a single exposure process of the image sensor in a first one of the pixels of the respective column to generate a plurality of pixel signals of the first pixel after one another and to output them to one of the column lines of the respective column; such that furthermore a plurality of readout steps are also carried out for the same exposure process in a second one of the pixels of the respective column to generate a plurality of pixel signals of the second pixel after one another and to output them to the same column line; and such that at least one readout step of the second pixel is carried out between the readout steps of the first pixel.

20. A method of reading out an image sensor for electronic cameras which includes a plurality of light-sensitive pixels arranged in rows and columns, in which pixels exposure dependent pixel signals are generated, with a plurality of column lines being associated with each respective column of light-sensitive pixels,
wherein, within a switching time interval in which one of the pixel signals is output via one of said plurality of column lines of the respective column, another one of said plurality of said column lines of the respective column is simultaneously charged or discharged by means of at least one precharge circuit, and
wherein, within another switching time interval in which another one of the pixel signals is output via the other one of the column lines, the one of the column lines is simultaneously charged or discharged by means of at least one precharge circuit or by means of said at least one precharge circuit.

21. The image sensor of claim 1,
wherein for each respective column of said light-sensitive pixels a portion of said light-sensitive pixels of the respective column is connected to said one of said plurality of column lines of the respective column and another portion of said light-sensitive pixels of the respective column is connected to said other one of said plurality of column lines of the respective column.

* * * * *